United States Patent
Zhang et al.

(10) Patent No.: US 7,177,370 B2
(45) Date of Patent: Feb. 13, 2007

(54) METHOD AND ARCHITECTURE FOR DUAL-MODE LINEAR AND SATURATED POWER AMPLIFIER OPERATION

(75) Inventors: Andrew Zhang, Portland, OR (US); Thomas R. Apel, Portland, OR (US); Christopher R. Stephens, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 399 days.

(21) Appl. No.: 10/740,238

(22) Filed: Dec. 17, 2003

(65) Prior Publication Data

US 2005/0135502 A1    Jun. 23, 2005

(51) Int. Cl.
*H04K 1/02* (2006.01)
*H04L 25/03* (2006.01)
*H04L 25/49* (2006.01)

(52) U.S. Cl. .................. 375/297; 375/308; 330/297; 332/100

(58) Field of Classification Search ................ 375/297, 375/308; 332/100; 330/297
See application file for complete search history.

(56) References Cited

U.S. PATENT DOCUMENTS

| | | |
|---|---|---|
| 3,109,992 A | 11/1963 | Elliott |
| 3,274,505 A | 9/1966 | Frisch et al. |
| 3,374,442 A | 3/1968 | Griffin |
| 3,967,207 A | 6/1976 | Wheatley, Jr. |
| 4,442,407 A | 4/1984 | Apel |
| 4,446,440 A | 5/1984 | Bell |
| 4,523,155 A | 6/1985 | Walczak et al. |
| 4,578,648 A | 3/1986 | Werrbach |
| 4,636,741 A | 1/1987 | Mitzlaff |
| 4,701,957 A | 10/1987 | Smith |
| 4,739,759 A | 4/1988 | Rexroth et al. |
| 4,760,347 A | 7/1988 | Li et al. |
| 4,794,343 A | 12/1988 | Yang |
| 4,994,757 A | 2/1991 | Bickley et al. |
| 5,030,922 A | 7/1991 | Rumreich et al. |
| 5,081,425 A | 1/1992 | Jackson et al. |
| 5,081,713 A | 1/1992 | Miyazaki |
| 5,126,688 A | 6/1992 | Nakanishi et al. |
| 5,129,098 A | 7/1992 | McGirr et al. |

(Continued)

FOREIGN PATENT DOCUMENTS

JP     61095603     5/1986

(Continued)

*Primary Examiner*—Mohammed Ghayour
*Assistant Examiner*—Erin M. File
(74) *Attorney, Agent, or Firm*—Bever Hoffman & Harms

(57) ABSTRACT

An RF transmitter provides both GSM and EDGE capability by implementing collector voltage control over the power transistor(s) in a power amplifier. During EDGE mode, linear base-biasing a power amplifier (PA) allows collector control to provide either saturated mode PA operation (during ramp up/ramp down) or linear mode PA operation (during data burst). Collector control can therefore be used to provide the accurate ramp up and ramp down profiles required for both GSM and EDGE burst output signals, and can also be used to set the level of the constant envelope data burst of a GSM burst output signal, while linear mode PA operation can provide the non-constant envelope EDGE data burst. A variable gain amplifier is used to adjust the input signal to the power amplifier such that the desired transmission level is achieved.

18 Claims, 9 Drawing Sheets

U.S. PATENT DOCUMENTS

| | | | |
|---|---|---|---|
| 5,138,274 A | 8/1992 | Nakanishi et al. |
| 5,144,258 A | 9/1992 | Nakanishi et al. |
| 5,182,527 A | 1/1993 | Nakanishi et al. |
| 5,192,919 A | 3/1993 | WieVzorek |
| 5,196,806 A | 3/1993 | Ichihara |
| 5,204,613 A | 4/1993 | Cripps et al. |
| 5,251,330 A | 10/1993 | Chiba et al. |
| 5,276,917 A | 1/1994 | Vanhanen et al. |
| 5,311,143 A | 5/1994 | Soliday |
| 5,337,006 A | 8/1994 | Miyazaki |
| 5,381,115 A | 1/1995 | Timmons et al. |
| 5,404,586 A | 4/1995 | Ishiguro |
| 5,422,598 A | 6/1995 | Maeda et al. |
| 5,438,683 A | 8/1995 | Durtler et al. |
| 5,442,317 A | 8/1995 | Stengel |
| 5,442,322 A | 8/1995 | Kornfeld et al. |
| 5,446,756 A | 8/1995 | Mallinckrodt |
| 5,493,255 A | 2/1996 | Murtojarvi |
| 5,511,234 A | 4/1996 | Ha |
| 5,530,404 A | 6/1996 | Debroux |
| 5,530,923 A | 6/1996 | Heinonen et al. |
| 5,548,813 A | 8/1996 | Charas et al. |
| 5,559,471 A | 9/1996 | Black |
| 5,561,395 A | 10/1996 | Melton et al. |
| 5,604,924 A | 2/1997 | Yokoya |
| 5,606,284 A | 2/1997 | Tamesue et al. |
| 5,613,229 A | 3/1997 | Baranowski et al. |
| 5,629,648 A | 5/1997 | Pratt |
| 5,640,691 A | 6/1997 | Davis et al. |
| 5,659,893 A | 8/1997 | Enoki et al. |
| 5,678,209 A | 10/1997 | Srakovsky |
| 5,689,815 A | 11/1997 | Yamazaki et al. |
| 5,710,519 A | 1/1998 | McCalpin et al. |
| 5,715,527 A | 2/1998 | Horii et al. |
| 5,732,334 A | 3/1998 | Miyake |
| 5,745,016 A | 4/1998 | Salminen |
| 5,757,226 A | 5/1998 | Yamada et al. |
| 5,757,237 A | 5/1998 | Staudinger et al. |
| 5,774,797 A | 6/1998 | Kawano et al. |
| 5,777,519 A | 7/1998 | Simopoulos |
| 5,808,515 A | 9/1998 | Tsuruoka et al. |
| 5,831,477 A | 11/1998 | Tsumura |
| 5,834,975 A | 11/1998 | Bartlett et al. |
| 5,834,977 A | 11/1998 | Maehara et al. |
| 5,861,776 A | 1/1999 | Swanson |
| 5,862,461 A | 1/1999 | Yoshizawa et al. |
| 5,872,481 A | 2/1999 | Sevic et al. |
| 5,892,396 A | 4/1999 | Anderson et al. |
| 5,892,397 A | 4/1999 | Belcher et al. |
| 5,892,403 A | 4/1999 | Brandt |
| 5,942,946 A | 8/1999 | Su et al. |
| 5,955,926 A | 9/1999 | Uda et al. |
| 5,986,509 A | 11/1999 | Lohninger |
| 5,990,751 A | 11/1999 | Takita |
| 5,994,963 A | 11/1999 | Kawai et al. |
| 6,025,753 A | 2/2000 | Landherr et al. |
| 6,034,519 A | 3/2000 | Yang |
| 6,049,703 A | 4/2000 | Staudinger et al. |
| 6,049,704 A | 4/2000 | Peckham et al. |
| 6,052,020 A | 4/2000 | Doyle |
| 6,064,269 A | 5/2000 | Ruppel et al. |
| 6,121,842 A | 9/2000 | Adlerstein et al. |
| 6,148,220 A | 11/2000 | Sharp et al. |
| 6,150,872 A | 11/2000 | McNeill et al. |
| 6,163,706 A | 12/2000 | Rozenblit et al. |
| 6,188,877 B1 | 2/2001 | Boesch et al. |
| 6,198,777 B1 | 3/2001 | Feher |
| 6,201,445 B1 | 3/2001 | Morimoto et al. |
| 6,239,658 B1 | 5/2001 | Tham |
| 6,242,983 B1 | 6/2001 | Shiao |
| 6,265,943 B1 | 7/2001 | Dening et al. |
| 6,327,462 B1 | 12/2001 | Loke et al. |
| 6,339,694 B1 | 1/2002 | Komara et al. |
| 6,342,810 B1 | 1/2002 | Wright et al. |
| 6,356,146 B1 | 3/2002 | Wright et al. |
| 6,356,745 B1 | 3/2002 | Lee et al. |
| 6,362,605 B1 | 3/2002 | May |
| 6,366,177 B1 | 4/2002 | McCune et al. |
| 6,369,649 B2 | 4/2002 | Nakajima |
| 6,374,127 B1 | 4/2002 | Park |
| 6,388,513 B1 | 5/2002 | Wright et al. |
| 6,397,090 B1 | 5/2002 | Cho |
| 6,405,054 B1 | 6/2002 | Rozenblit et al. |
| 6,433,639 B1 | 8/2002 | Numanami et al. |
| 6,459,334 B2 | 10/2002 | Wright et al. |
| 6,476,670 B1 | 11/2002 | Wright et al. |
| 6,566,944 B1 | 5/2003 | Pehlke et al. |
| 6,587,514 B1 | 7/2003 | Wright et al. |
| 6,617,927 B2 | 9/2003 | Numanami et al. |
| 6,624,702 B1 | 9/2003 | Dening |
| 6,636,114 B2 | 10/2003 | Tsutsui et al. |
| 6,658,578 B1 | 12/2003 | Laurenti et al. |
| 6,693,974 B2 | 2/2004 | Jin et al. |
| 6,697,436 B1 | 2/2004 | Wright et al. |
| 6,701,138 B2 | 3/2004 | Epperson et al. |
| 6,724,252 B2 | 4/2004 | Ngo et al. |
| 2001/0006355 A1 | 7/2001 | Park |
| 2002/0002038 A1 | 1/2002 | Seawright et al. |
| 2002/0077066 A1 | 6/2002 | Pehlke et al. |
| 2002/0127980 A1 | 9/2002 | Amanullah et al. |
| 2003/0083026 A1 | 5/2003 | Liu |
| 2003/0090325 A1 | 5/2003 | Canyon et al. |
| 2003/0141932 A1 * | 7/2003 | Toyota et al. ............... 330/285 |
| 2004/0185809 A1 * | 9/2004 | Jenkins ................... 455/127.2 |
| 2004/0203983 A1 * | 10/2004 | Klomsdorf et al. ......... 455/522 |
| 2004/0247040 A1 * | 12/2004 | Dennis et al. .............. 375/295 |
| 2005/0218989 A1 * | 10/2005 | Tsutsui et al. ............. 330/285 |

FOREIGN PATENT DOCUMENTS

| | | |
|---|---|---|
| JP | 5235657 | 9/1993 |

\* cited by examiner

METHOD AND ARCHITECTURE FOR DUAL-MODE LINEAR AND SATURATED POWER AMPLIFIER OPERATION

BACKGROUND OF THE INVENTION

1. Field of the Invention

The invention relates to wireless communications technologies, and in particular to a system and method for providing an efficient GSM-EDGE dual-mode transmitter.

2. Related Art

Communications using the global system for mobile telecommunication (GSM, see 3GPP(™) Technical Specification 45.005 v5.5.0 (August 2002)) system are transmitted within two predetermined transmission spectra—890–915 MHz in the uplink direction (i.e., from the mobile station to the base station) and 935–960 MHz in the downlink direction (i.e., from the base station to the mobile station). To make efficient use of these transmission spectra, bandwidth allocation to individual users is provided via frequency division multiple access (FDMA) and time division multiple access (TDMA).

FDMA is used to divide the transmission spectra into multiple carrier frequencies of 200 kHz. Each carrier frequency is then divided into 4.615 ms frames, and TDMA is used to divide each frame into eight time slots, or burst periods. Each of the eight burst periods is assigned to a single user, and a communications signal from that user must be modulated into discrete "burst output signals" that are transmitted only within that user's burst periods. In this manner, a single carrier frequency can handle up to eight simultaneous users.

To ensure that signal quality and integrity is maintained in the shared-channel approach used by GSM, it is important that burst output signals are precisely constrained within their associated burst periods. If a burst output signal turns on (i.e., ramps up) or turns off (i.e., ramps down) too quickly, the RF signal can spill out of the allowable transmission spectrum ("signal splatter") and interfere with the transmissions of other GSM users. However, if the burst output signal turns on or turns off too slowly, the user's own data transmission may be corrupted. Therefore, the GSM specification carefully defines a timing mask that provides an allowable power-time template ("burst profile") for a GSM burst output signal.

FIG. 1A shows a sample timing mask T(1) for GSM communications, which consists of an upper boundary U(1) and a lower boundary L(1). A GSM-compliant burst output signal (such as sample burst output signal S(B1)) must be confined between upper boundary U(1) and lower boundary L(1). Those boundaries define a burst profile that can be divided into three segments—a "ramp up" segment between times T0 and T1, a "data burst" segment between times T1 and T2, and a "ramp down" segment between times T2 and T3. So long as the ramp up and ramp down portions of burst output signal S(B3) fall between upper boundary U(1) and lower boundary L(1), problematic signal splatter and data corruption can be avoided.

The data burst is the portion of the burst output signal in which the actual communications data is transmitted. GSM uses Gaussian Minimum Shift Keying (GMSK) to modulate the communications data onto the selected carrier frequency. GMSK uses a two-state modulation algorithm that was originally selected to provide good power efficiency and acceptable bandwidth for mobile phone users. Because GMSK is a minimum shift keying modulation scheme, the data burst provided by a conventional GSM transmitter has a constant envelope (i.e., the amplitude of the signal does not change).

FIG. 1B shows a schematic diagram of a conventional GSM transmitter 100 that could be used to provide GSM burst output signal S(B1) shown in FIG. 1A. GSM transmitter 100 includes a baseband chip 102, a GMSK modulator 110, a local oscillator 120, and a power amplifier 130. Baseband chip 102 includes a data conversion digital-to-analog converter (DAC) 101A, a ramp control DAC 101B, and a smoothing filter 103. DAC 101 converts GSM digital burst data (i.e., the bits used to generate the burst output signal for a GSM burst period) into an analog baseband signal S(D1) (smoothed by smoothing filter 103) that GMSK modulator 110 then modulates onto an appropriate carrier frequency supplied by local oscillator 120. Typically, analog baseband signal S(D1) includes both an in-phase ("I") component and a quadrature ("Q") component that are modulated into a modulated signal S(M1) by GMSK modulator 120. Modulated signal S(M1) is then amplified by PA 130 into burst output signal S(B1).

As described above with respect to FIG. 1A, GMSK modulation is a constant envelope modulation technique. Therefore, PA 130 can be operated in saturated mode (i.e., as a voltage-limited amplifier) without introducing signal-degrading distortion into burst output signal S(B1). If PA 130 is operated in saturated mode, the amplitude of burst output signal S(B1) can be adjusted by changing the saturated (fully-on) output of PA 130. Therefore, to generate a GSM-compliant burst output signal S(B1) (i.e., a baseband signal S(D1) that has a power-time profile that fits the timing mask shown in FIG. 1A), the saturated output level of PA 130 must always fall within the limits defined by GSM timing mask T(1) shown in FIG. 1A.

Ramp control DAC 101B generates a ramp control signal S(R1) that regulates the gain provided by PA 130. Ramp control signal S(R1) is typically a feedback loop that compares the output level of PA 130 against the desired ramp profile (as shown in FIG. 1A). During the ramp up and ramp down portions of burst output signal S(B1), ramp control DAC 101B increases or decreases, respectively, the gain provided by PA 130 so that burst output signal S(B1) exhibits a GSM-compliant profile.

Note that the use of saturated amplification allows GSM transmitter 100 to be simply implemented while maintaining good power efficiency. Due in part to these factors, GSM is presently the most widely used cellular phone technology. However, the relatively low data rate of GSM is a limiting factor as mobile communications move beyond simple voice transmissions into more bandwidth-intensive transmissions (e.g., images and video). Therefore, the Enhanced Data for Global Evolution (EDGE) system has been developed as a new high-speed mobile data standard (3GPP Technical Specification 45.005).

EDGE is designed to provide a higher data rate (in equivalent occupied bandwidth) compared to conventional GSM technologies, but at the same time retain compatibility with the existing GSM infrastructure for maximum utility. EDGE uses eight-phase-shift-keying (8PSK) modulation that makes use of eight modulation states using three modulation bits, in contrast to the single modulation bit used by GMSK. However, the improved data efficiency of EDGE comes with added modulation complexity. Specifically, because EDGE uses 8PSK modulation, both the phase and the amplitude of the signal are modulated, and the data burst of an EDGE transmission is no longer a constant envelope signal.

FIG. 2A shows a sample timing mask T(2) for EDGE communications, which consists of an upper boundary U(2) and a lower boundary L(2). An EDGE-compliant burst output signal (such as sample burst output signal S(B2)) must be confined between upper boundary U(2) and lower boundary L(2). Like GSM burst output signal S(B1) shown in FIG. 1A, EDGE burst output signal S(B2) can be divided into three segments—a "ramp up" segment between times T0 and T1, a "data burst" segment between times T1 and T2, and a "ramp down" segment between times T2 and T3.

To maintain compatibility with current GSM systems, the ramp up and ramp down portions of EDGE burst output signal S(B2) are constrained in much the same manner as GSM burst output signal S(B1) shown in FIG. 1A. However, because of the 8PSK modulation used by EDGE, the data burst portion of EDGE burst output signal S(B2) is a non-constant envelope signal that can exhibit substantial amplitude variation.

Because of this data burst amplitude variation, an amplifier for an EDGE transmitter must be able to operate in the linear mode to avoid clipping and other forms of signal distortion. However, the amplifier should also be able to operate in the saturated mode to achieve good power efficiency when operating in GSM mode. Therefore, a GSM/EDGE (dual mode) system requires a dual-mode amplifier (i.e., an amplifier that operates in both the linear and saturated regions). Conventional EDGE amplifiers provide this dual-mode capability by adjusting the base biasing of the power transistors providing the amplification within those EDGE amplifiers.

For example, FIG. 2B shows a schematic diagram of a conventional EDGE transmitter 200 that could be used to provide EDGE burst output signal S(B2) shown in FIG. 2A. EDGE transmitter 200 includes a baseband chip 202, a GMSK/8PSK modulator 210, a local oscillator 220, a variable gain amplifier (VGA) 230, and a power amplifier (PA) 240. Baseband chip 202 includes a data conversion DAC 201A, a ramp control DAC 201B, and a smoothing filter 203, and also generates control signals VGA_CTRL and MODE.

During operation of EDGE transmitter 200, digital burst data (the bits for either a GSM burst output signal or an EDGE burst output signal) is converted by DAC 201A into an analog baseband signal S(D2) (smoothed by smoothing filter 203). GMSK/8PSK modulator 210 modulates baseband signal S(D2) onto an appropriate carrier frequency supplied by local oscillator 220. The resulting modulated signal S(M2) generated by GMSK/8PSK modulator 220 is then amplified by VGA 230 and/or PA 240 into burst output signal S(B2).

The type of modulation applied by GMSK/8PSK modulator 210 and the manner of amplification provided by VGA 230 and PA 240 is controlled by control signals MODE and VGA_CTRL. Control signal MODE is placed in either a GSM state or an EDGE state, depending on whether transmitter 200 is operating in GSM or EDGE mode, respectively. Baseband chip 202 provides control signal MODE to both GMSK/8PSK modulator 210 and PA 240, while providing control signal VGA_CTRL to VGA 230.

If transmitter 200 is operating in GSM mode, baseband chip 202 places signal MODE in a GSM state, which causes GMSK/8PSK modulator 210 to apply GMSK modulation to signal S(D2). Baseband chip also generates a control signal VGA_CTRL that causes VGA 230 to provide a fixed, high gain. Meanwhile, in response to control signal MODE being in the GSM state, PA 240 applies saturated mode amplification to modulated signal S(M2). This saturated mode amplification is controlled by a ramp control signal S(R2) provided by ramp control DAC 201B, in a manner substantially similar to that described with respect to FIG. 1B.

However, if transmitter 200 is operating in EDGE mode, baseband chip 202 places signal MODE in an EDGE state, which causes GMSK/8PSK modulator 210 to apply 8PSK modulation to signal S(D2). Placing signal MODE in the EDGE state also causes PA 240 to provide a linear gain, so that amplification of modulated signal S(M2) is provided by both VGA 230 and PA 240.

The linear mode amplification provided by VGA 230 is required because of the non-constant envelope of 8PSK-modulated signal S(M2). For example, when generating the data burst portion of burst output signal S(B2), the data-carrying amplitude variations of modulated signal S(M2) must be preserved. Therefore, a linear amplifier (i.e., VGA 230) must be used to provide the necessary signal gain, since a saturated amplifier (i.e., PA 240) will destroy any envelope variations.

The portions of modulated signal S(M2) that are amplified into the ramp up and ramp down portions of burst output signal S(B2) do not carry any transmission data. However, those portions of modulated signal S(M2) still exhibit non-constant envelopes due to the nature of analog signal S(D2) provided to modulator 211. Therefore, linear amplification must also be employed to prevent spectral splatter during the rapid ramp up and ramp down portions of burst output signal S(B2). Applying only saturated mode amplification in this situation (high gain applied to a non-constant envelope signal) can generate unwanted spectral components (spectral splatter) in burst output signal S(B2), thereby resulting in a non-compliant EDGE signal (i.e., a signal that does not meet the EDGE spectral mask specifications shown in FIG. 2C).

Unfortunately, providing the degree of control over VGA 230 required to generate an EDGE compliant burst output signal S(B2) can be very difficult due to the indirect nature of the control. Typically, the gain provided by a VGA is controlled by regulating the biasing of the amplifying transistor(s) in the VGA. VGA control provides a straightforward means for controlling the range of inputs to which linear amplification can be applied. However, providing the precise output control required to maintain compliance with the EDGE timing mask can be difficult to provide using only VGA control, since the magnitude of the output signal (i.e., burst output signal S(B2)) is dependant on the level of modulated signal S(M2), the gain of VGA 230, and the gain of PA 240. In addition, PA 240 is subject to gain expansion, which makes precise gain control even more difficult.

Further complicating the effort is the fact that because linear amplification is required for EDGE transmissions, VGA 230 must have a wide dynamic range. For example, the basic ramp up for GSM or EDGE requires 35 dB, while the particular transmit power control level (PCL) used for the transmission can impose another 23 dB offset. Therefore, to ensure that VGA 230 can operate in the linear mode for EDGE transmissions, VGA 230 must have a dynamic range of at least 58 dB (35 dB+23 dB). Having such a wide dynamic range would typically require a significant number of amplifier stages, which creates greater opportunity for accuracy degradation through process variations (during manufacturing) and temperature variations (during operation). A VGA that provides accurate linear response across such a wide dynamic range can be difficult to realize cost effectively.

Accordingly, it is desirable to provide an EDGE transmitter that does not require a high-precision, high-dynamic range amplifier.

SUMMARY OF THE INVENTION

According to an embodiment of the invention, a dual-mode transmitter includes a modulation circuit, a VGA, a PA, a collector control circuit, and a base bias circuit. The modulation circuit modulates a GSM or EDGE baseband signal onto a carrier frequency to generate a modulated signal. The VGA amplifies the modulated signal to an intermediate signal, which is then amplified by the PA to provide a GSM or EDGE burst output signal.

During GSM operation, the power transistors in the PA are base-biased into saturation so that collector control can be used to provide a GSM-compliant signal at the output of the PA. This collector control is based on a ramp control signal provided by a ramp control DAC. Since the ramp control signal during GSM operations is itself GSM compliant, the output of the PA is also GSM-compliant. According to an embodiment of the invention, the VGA applies a relatively high gain to the baseband signal during GSM operation to ensure that the PA is always pushed into saturation by the intermediate signal.

During EDGE operation, the PA operates in either linear or saturated mode, depending on what portion of the EDGE burst output signal is being generated. To provide this "multi-mode" PA operation, linear base-biasing is applied to the power transistor(s) in the PA. Collector control can then be used to cause the PA to operate in saturated mode or linear mode.

To generate the ramp up and ramp down portions of an EDGE burst output signal, collector control is based on a ramp control signal provided by the ramp control DAC. This ramp control signal-based collector control forces the PA to operate in saturated mode, so that the magnitude of the PA output is governed by the ramp control signal. Since the ramp control signal is itself EDGE-compliant, the ramp up and ramp down portions of the PA output meet the EDGE timing mask requirements.

According to an embodiment of the invention, the leading and trailing bits of the EDGE bit stream (which are non-data-carrying bits) can be replaced with bits having a constant logic state. The single tone sine wave generated from the constant bit stream can then be amplified during the ramp up and ramp down portions of the EDGE burst output signal without generating spurious spectral components (i.e., without causing spectral splatter).

To generate the data burst portion of an EDGE burst output signal, the collector voltage(s) of the power transistors in the PA are raised above a threshold voltage, thereby allowing the PA to operate in linear mode. The non-constant envelope EDGE data burst can then be generated by the combination of the VGA and PA. Since the PA is operating in linear mode, the EDGE data burst can be generated without data corruption. Furthermore, since the PA can provides the bulk of the gain required for the ramp up portion of the EDGE signal, the VGA need only provide enough gain to meet the PCL requirements (typically about 26 dB). The invention therefore eliminates the need for the high-gain VGA used in conventional EDGE transmitters. Furthermore, the use of collector voltage to control ramp transition levels in both GSM and EDGE modes is synergistic, since the well-known collector control techniques used in conventional GSM modes can be applied to EDGE operation.

These and other aspects of the present invention will be more fully understood in view of the following description of the exemplary embodiments and the drawings thereof.

DETAILED DESCRIPTION

Figure 3:
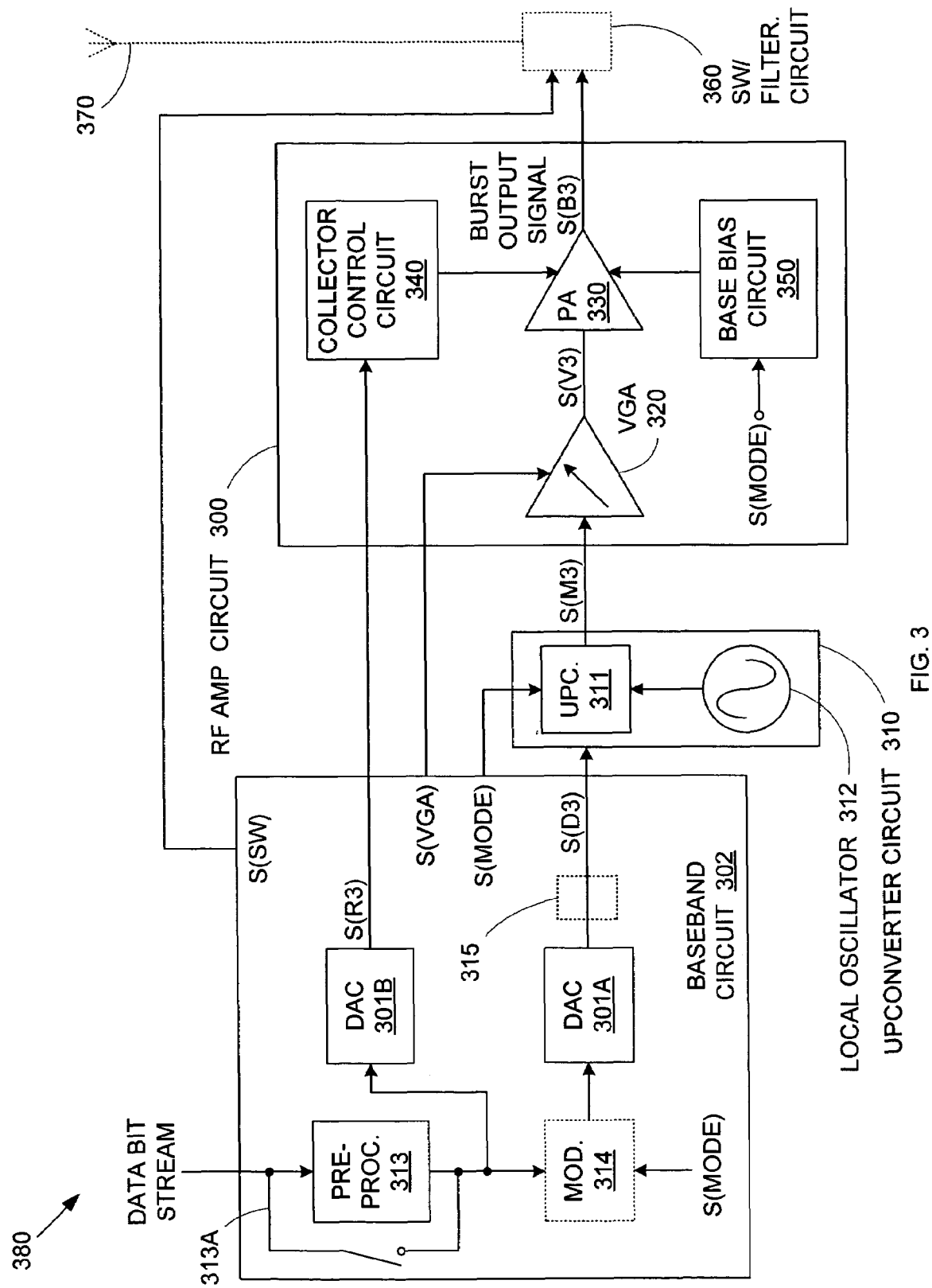
FIG. 3 is a schematic diagram of a GSM-EDGE dual mode transmitter in accordance with an embodiment of the invention.

FIG. 3 shows a schematic diagram of a transmitter 380 (such as a cellular telephone) that includes a RF amplifier circuit 300 in accordance with an embodiment of the invention. In addition to RF amplifier circuit 300, transmitter 380 includes a baseband circuit 302, an upconverter circuit 310, an optional switching/filtering circuit 360, and an antenna 370.

Note that according to an embodiment of the invention, baseband circuit 302 can be incorporated into a separate baseband chip. According to various other embodiments of the invention, upconverter circuit 310 and RF amplifier circuit 300 can likewise be incorporated into separate chips. According to other embodiments of the invention, all or various sub-combinations of baseband circuit 302, upconverter circuit 310, and RF amplifier circuit 300 can be incorporated into a single chip.

During operation of transmitter 380, a data bit stream for a GSM or EDGE transmission is provided to baseband circuit 302. In response to this data bit stream, a data conversion DAC 301A generates an analog baseband signal S(D3), while a ramp control DAC 301B generates an analog ramp control signal S(R3). According to an embodiment of the invention, baseband circuit 302 can include preprocessing logic 313 (described in greater detail below) for processing the data bit stream prior to conversion by DAC 301A and DAC 301B. Baseband circuit 302 can also include a post-processing filter 315 for smoothing the analog output of DAC 301A.

Note that, baseband signal S(D3) will typically comprise separate in-phase ("I") and quadrature ("Q") components (in which case DAC 201A would actually comprise an in-phase DAC and a quadrature DAC). However, according to various other embodiments of the invention, baseband signal S(D3) can comprise any type of analog baseband signal (e.g., baseband signal S(D3) can comprise separate mark ("M") and shift ("S") signals).

According to an embodiment of the invention, baseband circuit 302 can include a modulator 314 for applying an appropriate modulation to the digital data prior to analog conversion in data conversion DAC 301A. The type of modulation applied by modulator 314 and the mode of operation for RF amplifier circuit 300 is controlled by the state of a control signal S(MODE). Thus, when control signal S(MODE) is in a GSM state, modulator 314 applies GMSK modulation to the data bit stream. Likewise, when control signal S(MODE) is in an EDGE state, modulator 314 applies 8PSK modulation to the data bit stream.

Then, an upconverter 311 in upconverter circuit 310 adds a desired carrier frequency from a local oscillator 312 (also in upconverter circuit 310) to baseband signal S(D3) to generate a modulated signal S(M3). Note that, according to another embodiment of the invention, modulator 314 could be eliminated, and the data bit stream could be passed directly to data conversion DAC 301A. Data modulation can be applied in the analog domain by upconverter circuit 310. For example, upconverter 311 could comprise a modulator, and could modulate baseband signal S(D3) onto the desired carrier frequency using GMSK or 8PSK modulation, depending on whether control signal S(MODE) is in the GSM or EDGE state, respectively.

RF amplifier circuit 300 amplifies modulated signal S(M3) into a burst output signal S(B3). The type of amplification provided by RF amplifier circuit 300 depends on whether transmitter 380 is operating in GSM or EDGE mode. For example, during GSM mode operation, RF amplifier circuit 300 applies saturated amplification to modulated signal S(M3) to generate burst output signal S(B3). On the other hand, during EDGE mode operation, RF amplifier 300 applies a combination of saturated and linear mode amplification to modulated signal S(M3), to ensure that burst output signal S(B3) retains the amplitude variations generated by the 8PSK modulation of EDGE mode operations. These various modes of operation are described in greater detail below.

RF amplifier circuit 300 controls the magnitude of burst output signal S(B3) based on ramp control signal S(R3) generated by ramp control DAC 301B. Ramp control DAC 301B extracts the appropriate GSM or EDGE ramp up, ramp down, and transmit power-time functions (i.e., the timing mask specifications) from the data bit stream, and adjusts ramp control signal S(R3) to provide appropriate representations of those functions. For example, when generating the ramp up portion of a GSM burst output signal, ramp control DAC 301B could provide a ramp control signal S(R3) having a power-time profile matching the desired GSM-complaint ramp up power-time profile.

According to an embodiment of the invention, amplifier circuit 300 includes a variable gain amplifier (VGA) 320, a power amplifier (PA) 330, a collector control circuit 340, and a base bias circuit 350. VGA 320 is coupled to receive modulated signal S(M3) and provide an intermediate signal S(V3) to PA 330, which then amplifies intermediate signal S(V3) into burst output signal S(B3). As described in greater detail below, the specific behavior of VGA 320 and PA 330 depends on whether transmitter 380 is operating in GSM mode or in EDGE mode.

Once burst output signal S(B3) is generated by RF amplifier circuit 300, optional switching/filtering circuit 360 provides filtering, transmit and receive path selection, blocking, and/or impedance matching, based on a switching control signal S(SW) from baseband circuit 302. Burst output signal S(B3) is then sent to antenna 370 (or any other transmission element) for transmission.

GSM Operation Overview

During GSM operation, baseband circuit 302 generates a VGA control signal S(VGA) that causes VGA 320 to apply a high (fixed) gain to modulated signal S(M3) to generate intermediate signal S(V3). Meanwhile, in response to mode signal S(MODE) being in the GSM state, base bias circuit 350 adjusts the base voltage(s) of the power transistor(s) in PA 330 so that the power transistor(s) operates in saturated mode (saturated base-biasing). The gain provided by PA 330 is therefore determined by collector control circuit 340, which regulates the collector voltage(s) of the power transistor(s) in PA 330.

As is well known in the art, collector control provides a highly accurate means of power control, since setting the collector voltage of a power transistor effectively sets its saturated output. As noted above, collector control circuit 340 operates in response to ramp control signal S(R3) and increases, decreases, or maintains the collector voltage(s) in PA 330, depending on whether the ramp up, ramp down, or data burst portions of burst output signal S(B3) are being generated. Note that this collector control allows the accuracy requirements for the gain provided by VGA 320 to be relaxed, since the magnitude of intermediate signal S(V3) need only be large enough to push PA 330 into saturation.

Figure 4:
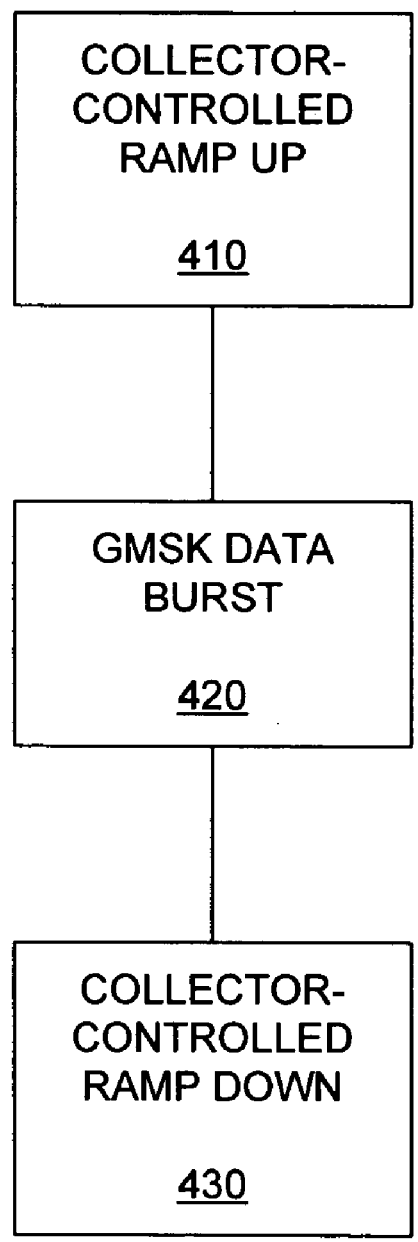
FIG. 4 is a flow diagram of the GSM operation of the dual mode transmitter of FIG. 3, in accordance with an embodiment of the invention.

FIG. 4 shows a flow diagram of this GSM burst output signal generation procedure. In a "COLLECTOR-CONTROLLED RAMP UP" step 410, VGA 320 is configured to provide a fixed gain by control signal S(VGA), while PA 330 is configured to operate in saturation mode by base biasing circuit 350 (in response to control signal S(MODE) being in its GSM state). Ramp control DAC 301B provides a ramp control signal S(R3) that corresponds to the desired GSM ramp up power-time profile, and in response, collector control circuit 340 adjusts the collector voltage(s) of the power transistor(s) in PA 330 so that burst output signal S(B3) exhibits the same GSM ramp up power-time profile.

Next, during a "GMSK DATA BURST" step 420, DAC 301B sets ramp control signal S(R3) at a level indicating the desired transmit power for the data burst portion of burst output signal S(B3). In response, collector control circuit 340 fixes the collector voltage(s) of the power transistor(s) in PA 330 at the desired transmit power, thereby ensuring that the data burst portion of burst output signal S(B3) is generated at the appropriate GSM transmit level.

After the data burst, in a "COLLECTOR-CONTROLLED RAMP DOWN" step 430, ramp control DAC 301B provides a ramp control signal S(R3) that corresponds to the desired GSM ramp down power-time profile. In response, collector control circuit 340 decreases the collector voltage(s) of the power transistor(s) in PA 330, thereby generating a GSM-compliant ramp down portion of burst output signal S(B3). In this manner, the full burst output signal S(B3) for a single time slot in a GSM transmission is generated.

EDGE Operation Overview

Note that when transmitter 380 is operating in GSM mode, VGA 320 provides a fixed gain while PA 330 is always operating in saturation. However, as described in greater detail below, when transmitter 380 is operating in EDGE mode, VGA 320 still provides a fixed gain, but PA 330 must sometimes operate in saturated mode and sometimes operate in linear mode. To provide both modes of PA operation, linear base-biasing is applied to PA 330 by base bias circuit 350. Then, by adjusting the collector voltage(s) provided to the power transistor(s) in PA 330, collector control circuit 340 can cause PA 330 to operate in linear mode (during EDGE data burst) or in saturated mode (during ramp up and ramp down).

As described above with respect to the GSM operation of transmitter 380, the use of saturated mode collector control allows a highly accurate ramp up and ramp down power-time profile to be created by PA 330. However, even with this precise power control, the non-constant envelope of a 8PSK-modulated signal, when combined with the rapid power changes that occur during the ramp up (and ramp down) portions of burst output signal S(B3), can generate unwanted spectral components leading to spectral splatter.

Therefore, according to an embodiment of the invention, transmitter 380 can pre-process the data bit stream during EDGE operations to ensure that modulated signal S(M3) maintains a constant envelope during generation of the ramp up and ramp down portions of burst output signal S(B3). This bit stream manipulation is possible due to the nature of the data bit stream for an EDGE signal.

A data bit stream for EDGE transmission consists of a set of leading bits, followed by a set of data bits, followed by a set of trailing bits. The leading and trailing bits correspond to the ramp up and ramp down portions, respectively, of the final burst output signal, while the data bits correspond to the data burst portion of the final burst output signal.

Figure 2A:
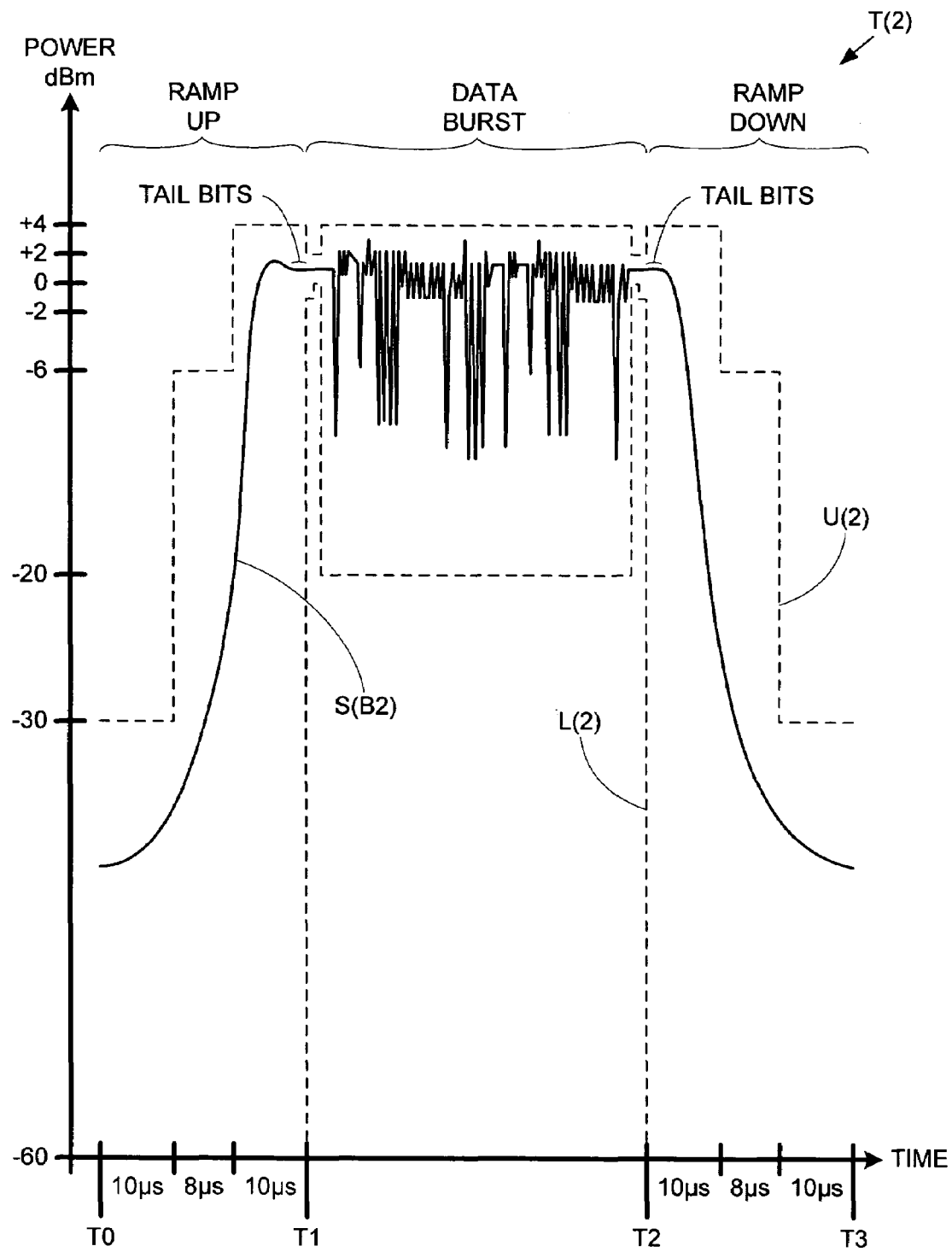
FIG. 2A is an example EDGE signal mask.

The leading and trailing bits are non-data bits and do not carry any necessary information once the data bit stream reaches data conversion DAC 301A. Except for nine "tail bits" immediately preceeding and following the data bits (as shown in FIG. 2A, and described in greater detail below), the leading and trailing bits are not defined by the EDGE specification. This lack of specification allows the leading and trailing bits (except for the tail bits) to be modified or even completely replaced without affecting the information contained in the data bits.

According to an embodiment of the invention, baseband circuit 302 can incorporate pre-processing logic 313 (e.g., a software algorithm or circuitry) for performing this replacement of leading and trailing bits during EDGE operations. A bypass path 313A allows the data bits of the EDGE data bits stream (and the entire GSM data bit stream) to bypass the bit manipulation provided by preprocessing logic 313. The replacement bits can be any set of bits that will result in modulated signal S(M3) (generated by upconverter circuit 310) having constant envelope portions corresponding to the ramp up and ramp down portions of burst output signal S(B3).

For example, the EDGE specification requires that both the leading and trailing bits in an EDGE data stream include a string of nine logic HIGH tail bits just before and after, respectively, the set of data bits (as shown in FIG. 2A). According to an embodiment of the invention, these tail bits are simply "extended" to fill in all the other leading and trailing bits—i.e., all the leading and trailing bits are set to logic HIGH levels.

A constant string of logic HIGH bits (or a constant string of logic LOW bits) provided at data conversion DAC 301A will ultimately be modulated into an 8PSK-modulated signal S(M3) that is a single tone sine wave. Because a single tone sine wave includes only a single frequency with constant amplitude, it is a constant envelope signal. Thus, by extending the tail bits of the EDGE data bit stream for the leading and trailing bits, the typically non-constant envelope 8PSK modulation scheme can be forced to generate a constant envelope signal for the ramp up and ramp down portions, respectively, of modulated signal S(M3). The saturated mode collector control applied to PA 330 can then be used to generate EDGE compliant ramp up and ramp down profiles without creating any spectral splatter.

Meanwhile, the data bits of the EDGE data bit stream are unchanged, since the data bits cannot be changed without affecting the actual information being conveyed. Therefore, the portion of modulated signal S(M3) corresponding to the data burst portion of burst output signal S(B3) will have a non-constant envelope. Note that spectral splatter is not a concern during the data burst, since the overall power level of signal S(B3) does not change significantly during the data burst. To prevent clipping and distortion of the transmitted data during the data burst portion of burst output signal S(B3), linear amplification must be used in RF amplifier circuit 300 to produce the data burst portion of burst output signal S(B3).

Thus, after the saturated amplification of the ramp up, portion of burst output signal S(B3) is complete, collector control circuit 340 raises the collector voltage provided to PA 330 above a fixed (threshold) collector voltage. The fixed collector voltage is selected to be high enough that the maximum output power of burst output signal S(B3) will not push PA 330 into saturation. According to an embodiment of the invention, the fixed collector voltage is the maximum supply voltage available to transmitter 380, which maximizes the linear amplification range of PA 330. In this manner, PA 330 is configured as a fixed gain amplifier by base bias circuit 350 and collector control circuit 340.

Figure 2B:
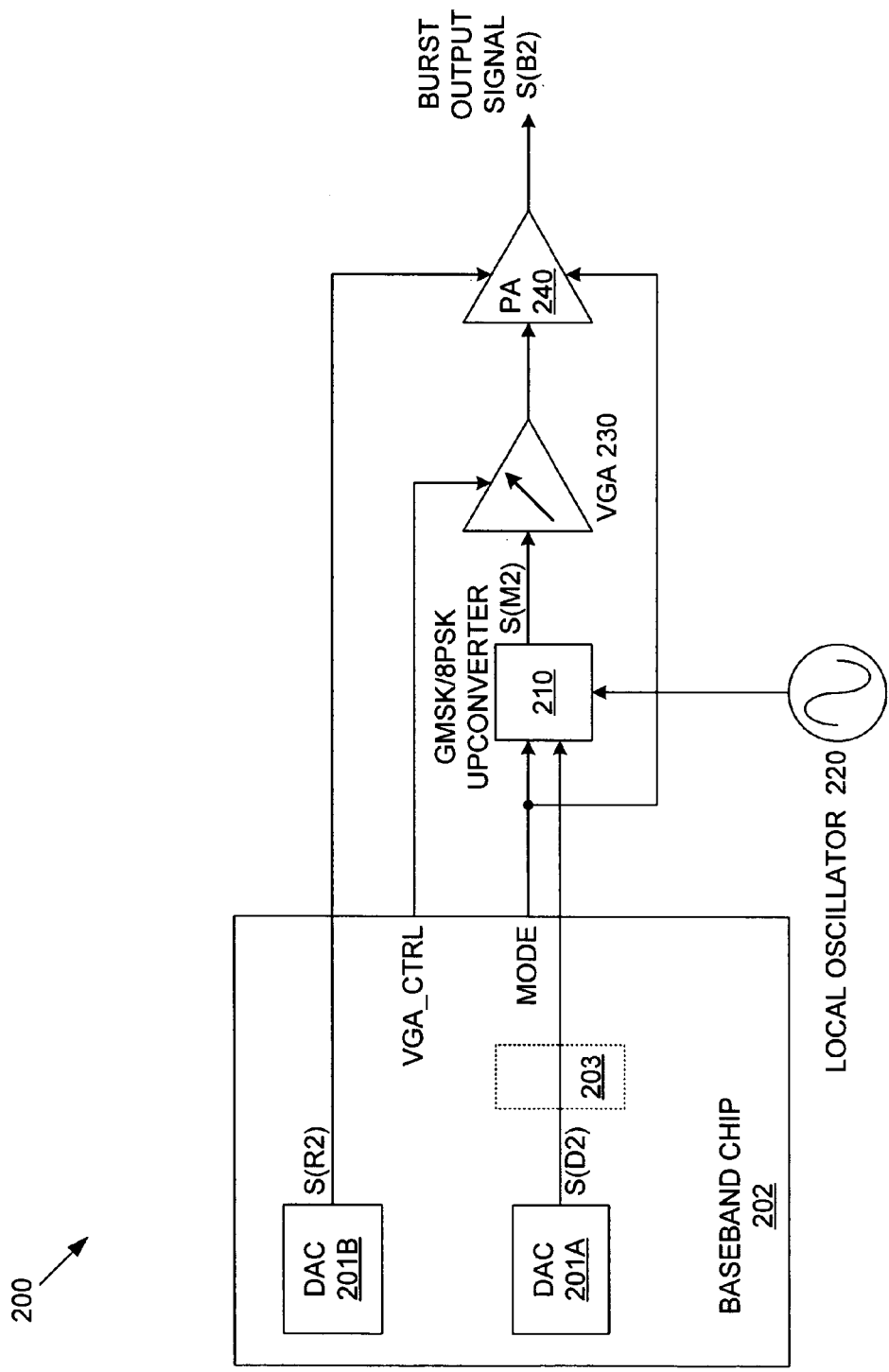
FIG. 2B is a schematic diagram of a conventional GSM-EDGE dual mode transmitter.
Figure 2C:
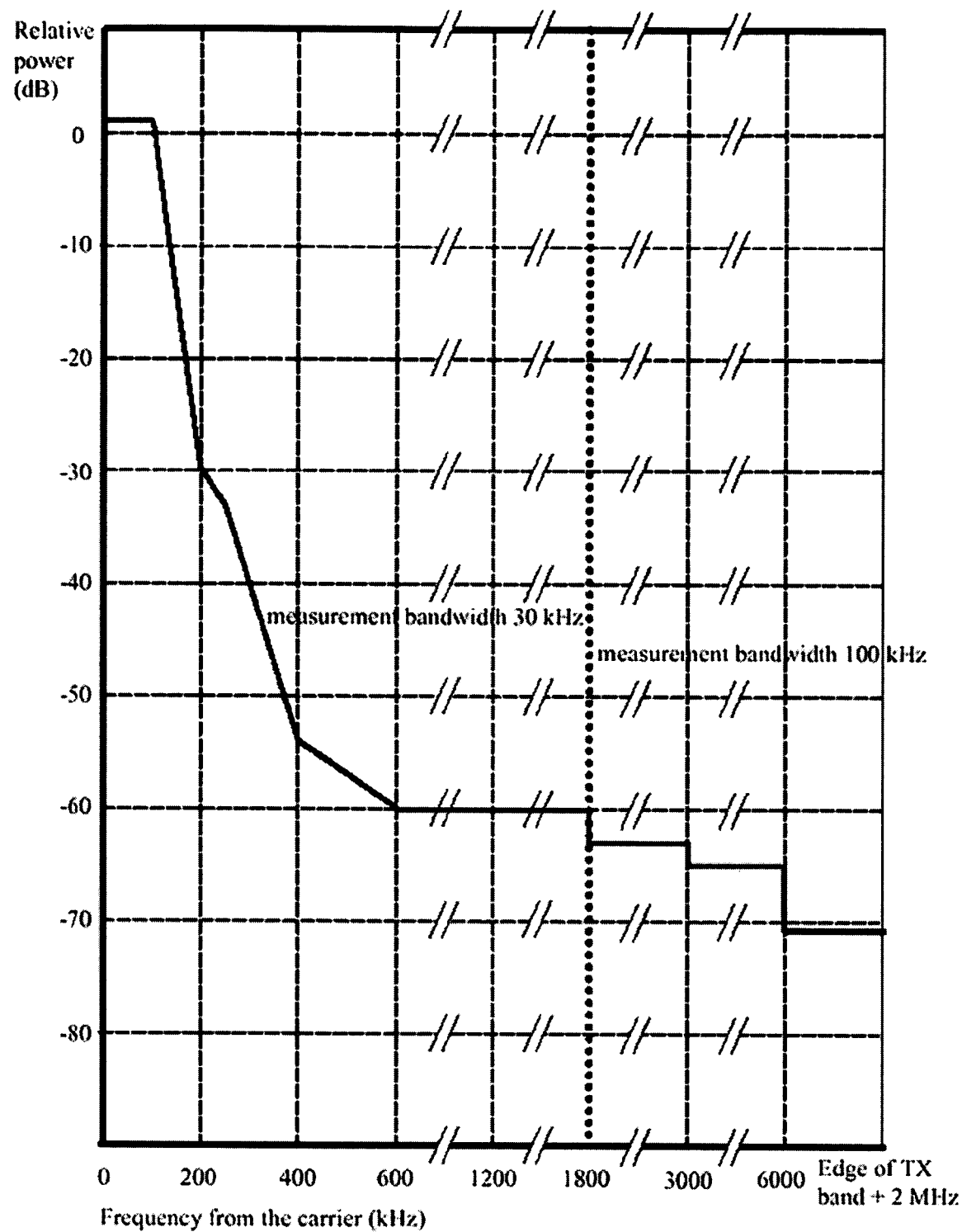
FIG. 2C is an example EDGE spectral mask.

As a result, any power level changes during the data burst portion of burst output signal S(B3) are controlled by VGA 320. However, unlike a VGA in a conventional EDGE transmitter (e.g., VGA 230 in FIG. 2B), VGA 320 is not required to have a wide dynamic range, since PA 330 provides the power ramping functionality required for burst output signal S(B3). Therefore, VGA 320 can be much simpler (e.g., lower part count due to simplified control requirements) and much less costly to produce than the significantly higher-gain VGAs used in conventional EDGE transmitters. For example, while VGA 230 (in FIG. 2B) might require a dynamic range of at least 58 dB (as described above), VGA 320 need only provide enough gain for the variations during an EDGE data burst (on the order of 26 dB).

Once the data burst portion of burst output signal S(B3) is complete, collector control circuit 340 once again begins applying collector control to PA 330 to regulate the level of burst output signal S(B3). The ramp down portion of burst output signal S(B3) is then generated in much the same way that the ramp up portion of burst output signal S(B3) was generated (described in detail above). In particular, the tail bits following the data bits are extended to replace the remaining trailing bits, and the saturated mode collector control applied to PA 330 generates the appropriate ramp down profile.

Figure 5:
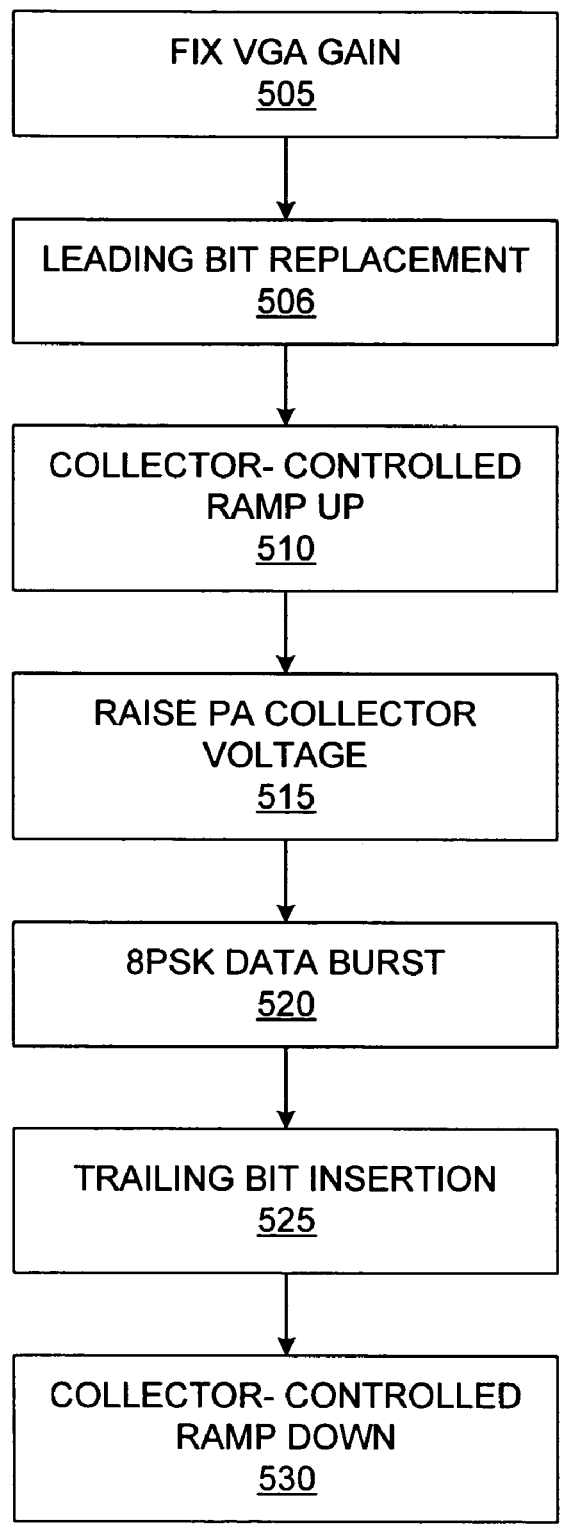
FIG. 5 is a flow diagram of the EDGE operation of the dual mode transistor of FIG. 3, in accordance with an embodiment of the invention.

FIG. 5 shows a flow diagram of this EDGE burst output signal generation procedure. In a "FIX VGA GAIN" step 505, the gain of VGA 320 is fixed at the level required to provide the necessary data burst gain once the appropriate ramp up power gain is provided by PA 330. Then, in a "LEADING BIT INSERTION" step 506, the leading bits in the EDGE data bit stream are replaced with a constant bit value (e.g., the value of the tail bits in the data stream). As described above, the replacement bits provided in step 506 cause the 8PSK modulation applied by modulator 314 (or upconverter circuit 310) to create modulated signal S(M3) that has a constant envelope portion (single tone sine wave) corresponding to the ramp up portion of burst output signal S(B3).

Then, in a "COLLECTOR-CONTROLLED RAMP UP" step 510, collector control circuit 340 increases the collector voltage(s) of the power transistor(s) in PA 330 in response to ramp control signal S(R3), thereby amplifying the constant envelope portion of modulated signal S(M3) to generate the ramp up portion of burst output signal S(B3). As noted above, the use of collector control to regulate the output of PA 330 allows this ramp up portion of burst output signal S(B3) to meet the precise timing and spectral requirements of the EDGE specification.

Once the ramp up of burst output signal S(B3) is complete, collector control circuit 340 raises the collector voltage of PA 330 to a to an appropriate fixed collector voltage (e.g., to a supply voltage provided to RF amplifier circuit 300) in a "RAISE PA COLLECTOR VOLTAGE" step 515. Because the collector voltage of PA 330 is essentially raised "out of the way" of intermediate signal S(V3) in step 515, the operation of PA 330 switches from saturated mode to linear mode. Therefore, during a subsequent "8PSK DATA BURST" step 520, PA 330 behaves as a linear, constant gain amplifier to generate the non-constant envelope EDGE data burst without clipping or other forms of data degradation.

In a "TRAILING BIT INSERTION" step 525, the trailing bits in the EDGE digital data stream provided to DAC 301A are replaced with a constant bit value (e.g., the nine-bit tail bit value), just as in step 506. Note that step 535 will typically overlap step 520 somewhat, since the EDGE digital data stream is provided continuously to data conversion DAC 301A. The replacement trailing bits result in another constant envelope portion of modulated signal S(M3).

Then, in a "COLLECTOR-CONTROLLED RAMP DOWN" step 530, collector control circuit 340 reduces the collector voltage(s) of the power transistor(s) in PA 330 in response to ramp control signal S(R3). This return to collector control allows PA 330 to amplify the second constant envelope portion of modulated signal S(M3) (corresponding to the trailing bits inserted in step 525) into the EDGE-compliant ramp down portion of burst output signal S(B3). In this manner, the full burst output signal S(B3) for a single time slot in an EDGE transmission is generated.

Figure 6:
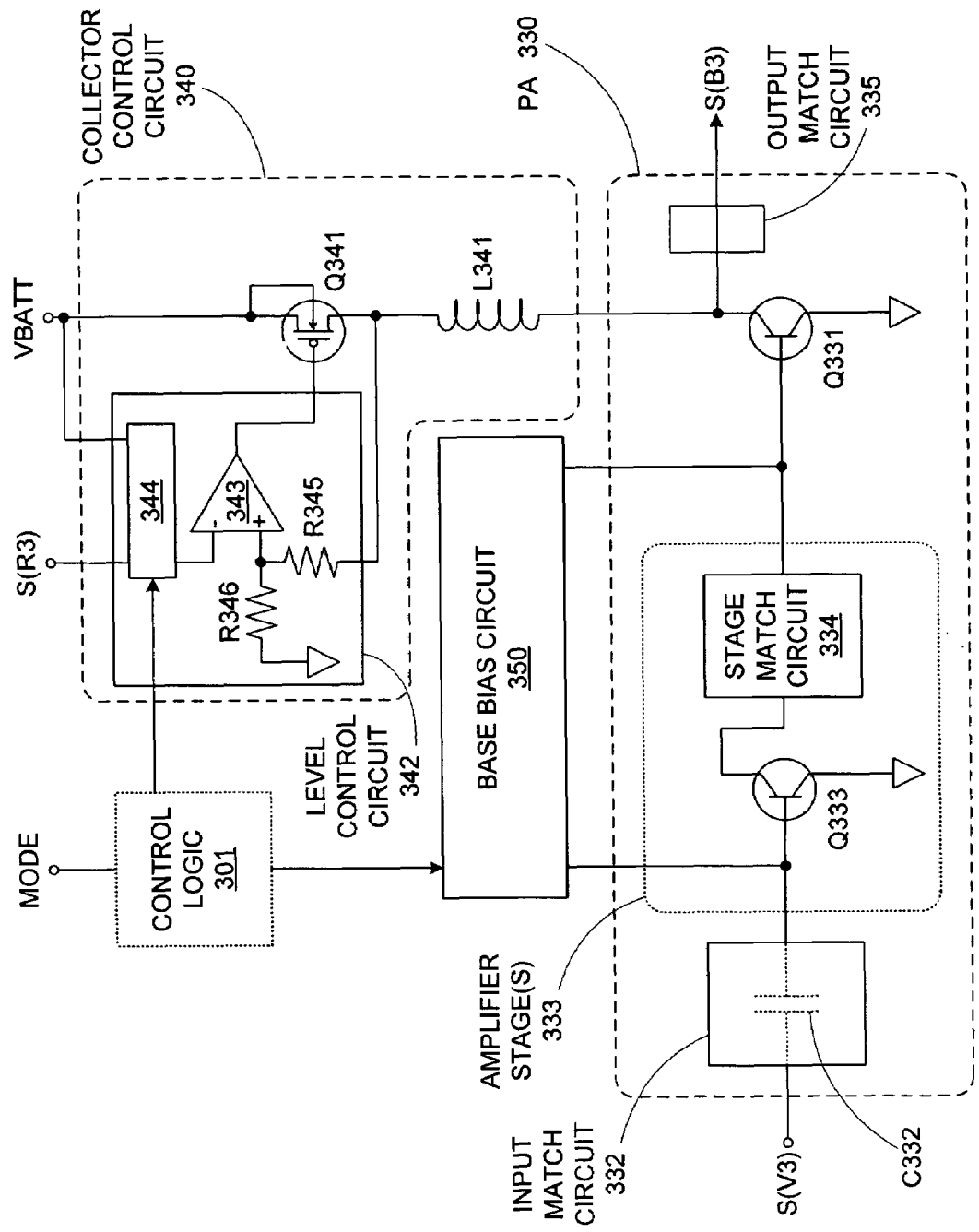
FIG. 6 is a schematic diagram of a power amplifier for a GSM-EDGE dual mode transmitter in accordance with an embodiment of the invention.

As described above, PA 330 allows transmitter 380 to meet the requirements of both GSM and EDGE transmissions by providing both saturated and linear amplification. FIG. 6 shows a schematic diagram of PA 330 and collector control circuit 350, according to an embodiment of the invention. PA 330 includes a power transistor Q331, optional additional amplifier stage(s) 333, an input match circuit 332, and an output match circuit 335. Each optional amplifier stage 333 includes a power transistor Q333 and a stage match circuit 334 coupled between the collector of power transistor Q333 and the gate of the power transistor in the next stage (e.g., transistor Q331).

Input match circuit 332 provides impedance matching and DC voltage filtering to ensure that signal S(V3) is properly passed to transistor Q333 (or transistor Q331 if no additional amplifier stages 333 are present) without any DC offset. For example, according to an embodiment of the invention, input match circuit 332 can include a capacitor C332 that is sized to match the output impedance of VGA 320 (shown in FIG. 3). Stage match circuit 334 in each additional stage 333 and output match circuit 335 can include similar circuitry for providing impedance matching and DC filtering.

Collector control circuit 340 includes a level control circuit 342, a PMOS transistor Q341, and an inductor L341. PMOS transistor Q341 and inductor L341 are serially connected between supply voltage VBATT and the collector of power transistor Q331 in PA 330. Level control circuit 342 regulates the gate voltage of PMOS transistor Q341 according to ramp control signal S(R3) and mode signal S(MODE), while inductor L341 ensures that the output RF signal (i.e., burst output signal S(B3) is blocked from level control circuit 342).

According to an embodiment of the invention, level control circuit 342 can include an operational amplifier (op-amp) 343 and a reference voltage circuit 344. The output of op-amp 343 is connected to the gate of PMOS transistor Q341, while the drain of PMOS transistor Q341 is connected to the non-inverting input of op-amp 343 via a resistor R345. A resistor R346 also couples the non-inverting input of op-amp 343 to ground, thereby forming a voltage divider with resistor R345. By properly sizing resistors R345 and R346, any desired proportion of the drain voltage of transistor Q341 can be applied to the non-inverting input of op-amp 343. Note that according to another embodiment of the invention, the drain of transistor Q341 can be connected directly to the non-inverting input of op-amp 343. Therefore, op-amp 343 adjusts the gate voltage of transistor Q341 until the drain voltage of transistor Q341 matches a linearly scaled version (based on resistors R345 and R346) of the voltage provided at the inverting input of op-amp 343.

Figure 1A:
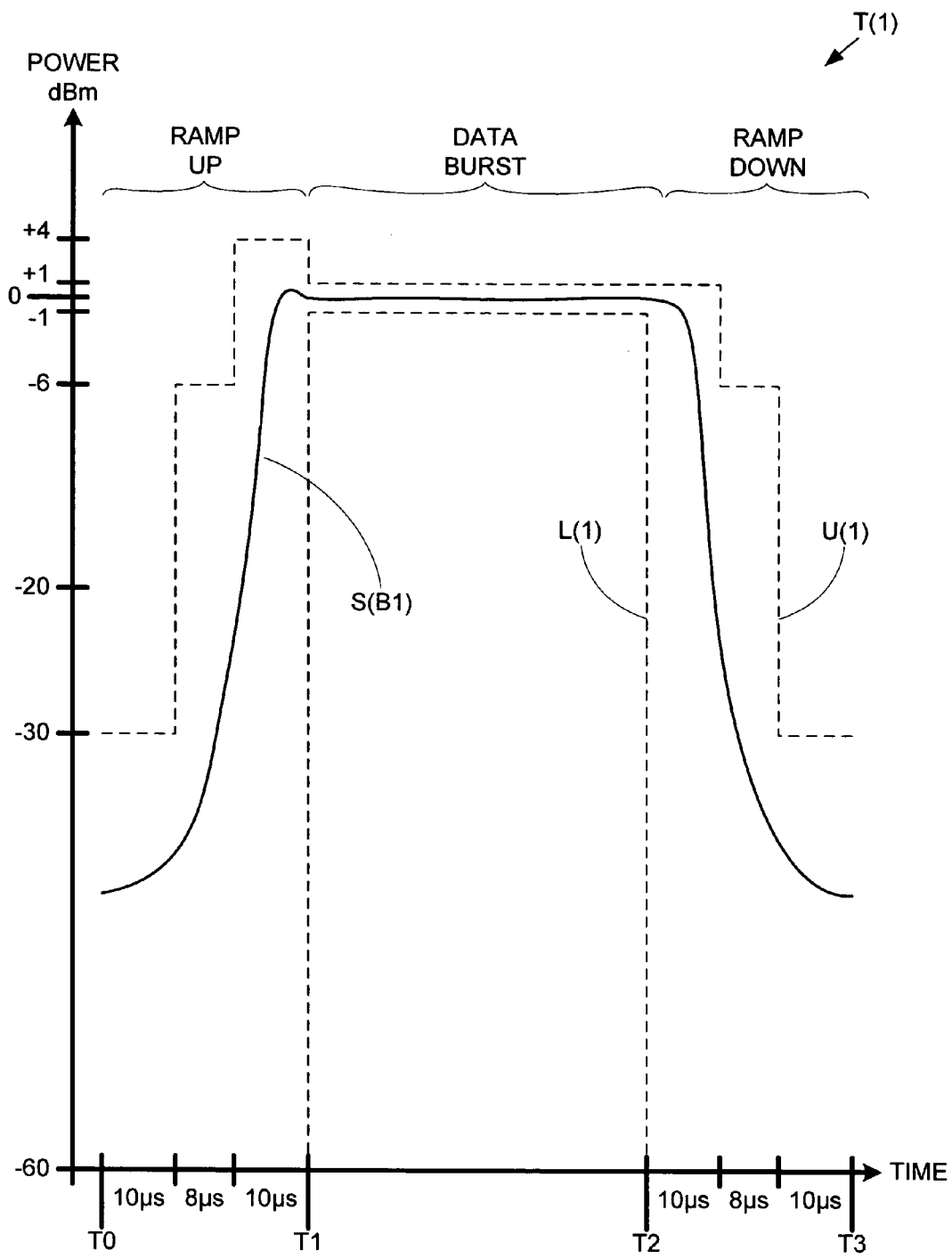
FIG. 1A is an example GSM signal mask.
Figure 1B:
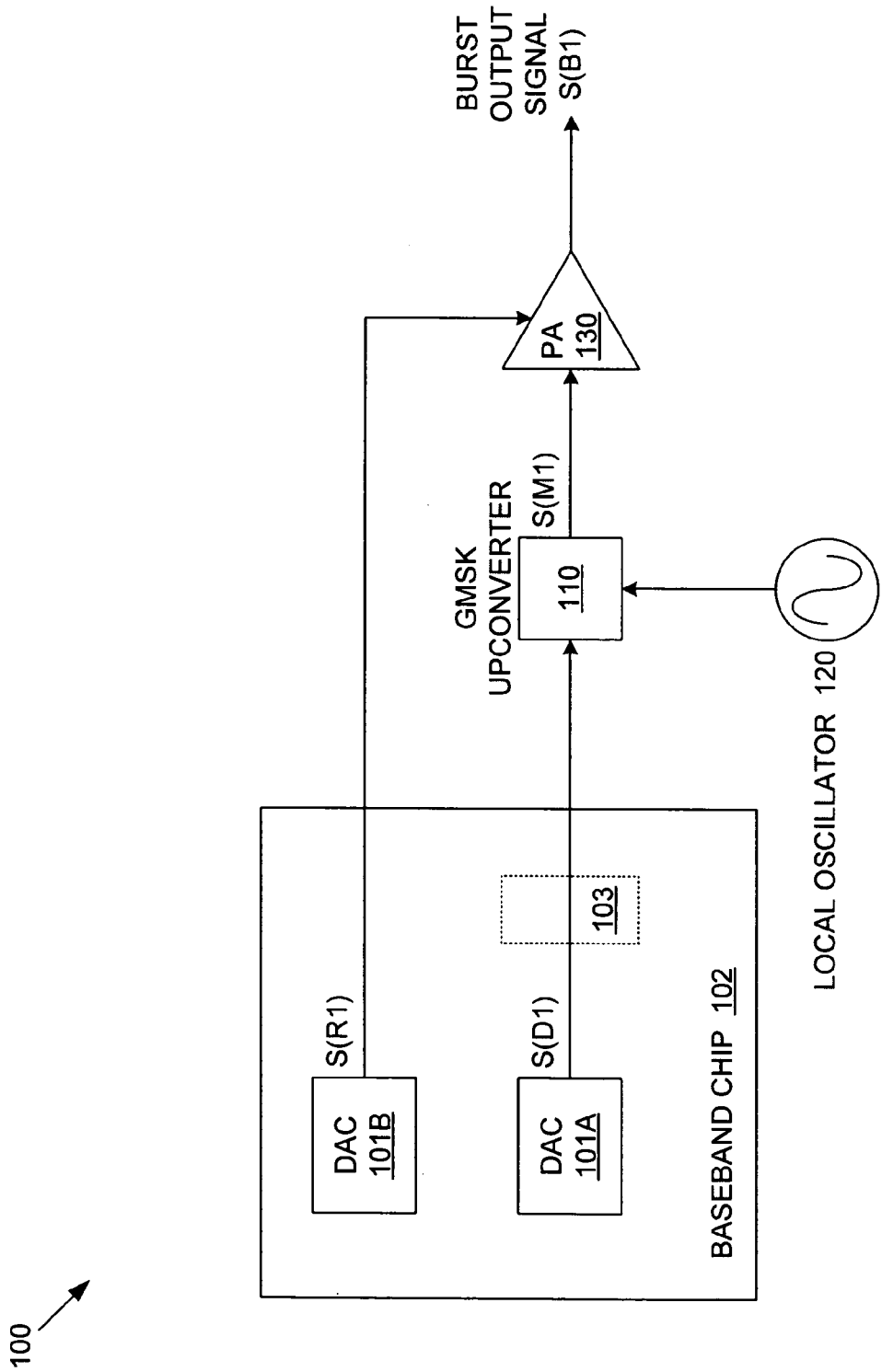
FIG. 1B is a schematic diagram of a conventional GSM transmitter.

Reference voltage circuit 344 is coupled to receive ramp control signal S(R3) and provide an appropriate signal to the non-inverting input of op-amp 343. As indicated above with respect to timing masks T(1) and T(2) shown in FIGS. 1A and 2A, respectively, burst output signal S(B3) is made up of a ramp up portion, a data burst portion, and a ramp down portion. The operation of level control circuit 342 therefore can vary according to the mode of operation (i.e., GSM or EDGE) and also according to the portion of burst output signal S(B3) being generated.

GSM Power Amplifier Operation

During GSM operations the amplitude of burst output signal S(B3) is directly related to the amplitude of ramp control signal S(R3). Therefore, when mode signal S(MODE) is in its GSM state, reference voltage circuit 344 simply passes ramp control signal S(R3) directly to op-amp 343, so that the drain voltage of PMOS transistor Q341 (and hence the collector voltage of power transistor Q331) tracks ramp control signal S(R3). At the same time, bias control circuit 350 biases the base of power transistor Q331 (and the base(s) of any power transistors Q333) below its threshold of conduction (saturation-biasing), so that saturated amplification is provided.

Because power transistor Q331 is operating in saturated mode, the modulated signal S(V3) provided to PA 330 is amplified to the maximum power output of power transistor Q331. At the same time, the maximum power output of transistor Q331 is determined by its collector voltage, which is in turn determined by ramp control signal S(R3). Therefore, (constant envelope) modulated signal S(V3) is amplified into a burst output signal S(B3) that matches the time-power profile of ramp control signal S(R3) and therefore falls within the required GSM timing mask.

For example, during the ramp up portion of burst output signal S(B3), the collector voltage of power transistor Q331 increases as ramp control signal S(R3) increases. The specific change in collector voltage is driven by the ramp up and transmit power information contained within ramp control signal S(R3), so that the output of PA 330 at the collector of transistor Q331 exhibits a GSM-compliant ramp up. In a similar manner, ramp control signal S(R3) controls the decrease in collector voltage during the ramp down portion of burst output signal S(B3), thereby ensuring a GSM-compliant ramp down.

During the data burst portion of burst output signal S(B3), level control circuit 342 holds the collector voltage of power transistor Q331 at a constant voltage corresponding to the desired transmit power level. Then, because base bias circuit 350 biases the base of transistor Q331 below its threshold of conduction, transistor Q331 is still operating in saturated mode and its collector voltage determines the output power of PA 330. In this manner, the data burst portion of burst output signal S(B3) can be precisely set to a desired transmit power.

Note that for clarity, collector control circuit 340 is depicted as only regulating the collector voltage of power transistor Q331. However, according to various other embodiments of the invention, collector control circuit 340 can also control the collector voltages of any or all transistors Q333 in optional amplifier stages 333.

EDGE Power Amplifier Operation

As described above, the non-constant envelope of the 8PSK modulated signal in EDGE operations means that PA 330 must switch between saturated mode and linear mode amplification when generating an EDGE burst output signal S(B3). This operational mode switching is accomplished via an appropriate combination of controls provided by base bias circuit 350 and collector control circuit 340.

During EDGE operations, base bias circuit 350 applies linear base-biasing to power transistor Q331 (and any number of additional power transistors Q333). Meanwhile, collector control circuit 340 regulates the collector voltage(s) of power transistor Q331 (and any number of additional power transistors Q333) to control the actual mode of operation of PA 330.

For example, to generate the ramp up portion of burst output signal S(B3), reference voltage circuit 344 passes ramp control signal S(R3) directly to op-amp 343, so that the drain voltage of PMOS transistor Q341 (and hence the collector voltage of power transistor Q331) tracks ramp control signal S(R3). Therefore, intermediate signal S(V3) (which is a constant envelope signal at this point, as described above) is amplified by PA 330 to match the power-time profile of ramp control signal S(R3) and produce an EDGE-compliant ramp up portion of burst output signal S(B3).

To generate the data burst for bust signal S(B3), reference voltage circuit 344 provides supply voltage VBATT to the non-inverting input of op-amp 343, thereby forcing the drain voltage of transistor Q341 (and hence the collector voltage of power transistor Q331) to be substantially equal to voltage VBATT. Note that while p-type transistor Q341 could be replaced with an n-type transistor, the use of a p-type transistor allows the collector voltage of power transistor Q331 to be pulled essentially to supply voltage VBATT, thereby maximizing the dynamic range of PA 330.

Configured in this manner, PA 330 behaves as a linear fixed gain amplifier. The gain of PA 330 is no longer limited by collector control circuit 340, and so the output level of burst output signal S(B3) during an EDGE data burst is controlled by the amplitude of intermediate level signal S(V3) provided by VGA 320 (shown in FIG. 3). As noted above, the actual strength of intermediate signal S(V3) will typically be low, with VGA 320 mainly providing the amplitude needed during the non-constant envelope data burst.

After the data burst of burst output signal S(B3) is completed, the ramp down portion of burst output signal S(B3) is generated, as reference voltage circuit 344 passes ramp control signal S(R3) directly to op-amp 343, so that the drain voltage of PMOS transistor Q341 (and hence the collector voltage of power transistor Q331) tracks ramp control signal S(R3). Therefore, intermediate signal S(V3) (which is a constant envelope signal at this point, as described above) is amplified by PA 330 to match the power-time profile of ramp control signal S(R3) and produce an EDGE-compliant ramp down portion.

Note that according to an embodiment of the invention, dedicated control logic 301 can be included to ensure that collector control circuit 340 and base bias circuit 350 provide the appropriate control over PA 330 during generation of the ramp up/settle and data burst portions of burst output signal S(B3). According to another embodiment of the invention, the logic can be incorporated into collector control circuit 340 and base bias circuit 350 so that separate control logic is not required.

The various embodiments of the structures and methods of this invention that are described above are illustrative only of the principles of this invention and are not intended to limit the scope of the invention to the particular embodiments described. Thus, the invention is limited only by the following claims and their equivalents.

The invention claimed is:

1. A transmitter comprising:
a variable gain amplifier (VGA) for applying a first gain to a first modulated signal to generate a second modulated signal;
a power amplifier for applying a second gain to the second modulated signal to generate a burst output signal, wherein the power amplifier comprises a first power transistor; and
a collector control circuit for controlling the second gain by supplying a fixed collector voltage to a collector of the first power transistor in response to a first control signal, and by supplying a ramp control signal to the collector of the first power transistor in response to a second control signal;
a baseband circuit for converting a data bit stream into a baseband signal; and
an upconverter circuit for modulating the baseband signal onto a carrier frequency,
wherein the data bit stream comprises of a series of leading bits followed by a series of data bits followed by a series of trailing bits,
wherein when the transmitter is operating in Global System for Mobile Telecommunication (GSM) mode, a first digital-to-analog conversion (DAC) circuit in the baseband circuit performs digital-to-analog conversion on the data bit stream to generate the baseband signal, and
wherein when the transmitter is operating in Enhanced Data for Global Evolution (EDGE) mode, the first DAC circuit performs digital-to-analog conversion on an adjusted bit stream, the adjusted bit stream being created by replacing the series of leading bits and the series of trailing bits in the data bit stream with replacement bits, the replacement bits all having a common logic state.

2. The transmitter of claim 1, further comprising a bias control circuit for applying linear base-biasing to the first power transistor in response to a third control signal, and for applying saturation base-biasing to the first power transistor in response to a fourth control signal.

3. The transmitter of claim 2, wherein the power amplifier further comprises a second power transistor,
wherein the collector control circuit supplies the fixed collector voltage to a collector of the second power transistor in response to the first control signal, and supplies the ramp control signal to the collector of the second power transistor in response to the second control signal, and wherein the bias control circuit applies linear base-biasing to the second power transistor in response to the third control signal, and applies saturation base-biasing to the second power transistor in response to the fourth control signal.

4. The transmitter of claim 1, wherein the fixed collector voltage comprises a supply voltage of the transmitter.

5. The transmitter of claim 1, wherein when the transmitter is operating in Global System for Mobile Telecommunication (GSM) mode, the bias control circuit applies saturation base-biasing to the first power transistor,
   wherein when the transmitter is operating in GSM mode, the collector control circuit applies the ramp control signal to the collector of the first power transistor to cause the PA to generate the burst output signal,
   wherein when the transmitter is operating in Enhanced Data for Global Evolution (EDGE) mode, the bias control circuit applies linear base-biasing to the first power transistor,
   wherein when the transmitter is operating in EDGE mode, the collector control circuit supplies the ramp control signal to the collector of the first power transistor to cause the PA to generate a ramp up portion and a ramp down portion of the burst output signal, and
   wherein when the transmitter is operating in EDGE mode, the collector control circuit supplies the fixed collector voltage to the collector of the first power transistor to cause the PA to generate a data burst portion of the burst output signal.

6. The transmitter of claim 5, wherein when the transmitter is operating in GSM mode, the first gain is at a first level,
   wherein when the transmitter is operating in EDGE mode, the first gain is at a second level, the first level being greater than the second level.

7. The transmitter of claim 1, wherein both the series of leading bits and the series of trailing bits includes a set of tail bits, and wherein the replacement bits have the same logic state as the tail bits.

8. The transmitter of claim 1, wherein the baseband circuit further comprises a second DAC circuit,
   wherein when the transmitter is operating in GSM mode, the second DAC circuit applies digital-to-analog conversion to the data bit stream to generate the ramp control signal, and
   wherein when the transmitter is operating in EDGE mode, the second DAC circuit applies digital-to-analog conversion to the adjusted bit stream to generate the ramp control signal.

9. The transmitter of claim 8, wherein the baseband circuit further comprises a modulator,
   wherein when the transmitter is operating in GSM mode, the modulator applies GMSK modulation to the data bit stream before providing the data bit stream to the first DAC circuit, and
   wherein when the transmitter is operating in EDGE mode, the modulator applies Eight Phase Shift Keying (8PSK) modulation to the adjusted bit stream before providing the adjusted bit stream to the first DAC circuit.

10. The transmitter of claim 8, wherein when the transmitter is operating in GSM mode, the upconverter circuit applies GMSK modulation to the baseband signal, and
   wherein when the transmitter is operating in EDGE mode, the upconverter circuit applies Eight Phase Shift Keying (8PSK) modulation to the baseband signal.

11. A method for operating a Global System for Mobile Telecommunication (GSM)/Enhanced Data for Global Evolution (EDGE) dual-mode transmitter, the method comprising:
   generating a GSM-compliant burst output signal by saturation base-biasing a power transistor and regulating a collector voltage of the power transistor to amplify a GMSK-modulated signal into the GSM-compliant burst output signal, wherein regulating the collector voltage of the power transistor to amplify the GMSK-modulated signal comprises setting the collector voltage of the power transistor equal to a first ramp control signal;
   generating a ramp up portion of an EDGE-compliant burst output signal by linear base-biasing the power transistor and regulating the collector voltage of the power transistor to amplify a first portion of a Eight Phase Shift Keying (8PSK)-modulated signal into the ramp up portion of the EDGE-compliant burst output signal, whereby the power transistor operates in saturated mode, wherein regulating the collector voltage of the power transistor to amplify the first portion of the 8PSK-modulated signal comprises setting the collector voltage of the power transistor equal to a second ramp control signal;
   generating a data burst portion of the EDGE-compliant burst output signal by linear base-biasing the power transistor and setting the collector voltage of the power transistor equal to a supply voltage to amplify a second portion of the 8PSK-modulated signal into the data burst portion of the EDGE-compliant burst output signal, whereby the power transistor operates in linear mode;
   generating a ramp down portion of the EDGE-compliant burst output signal by linear base-biasing the power transistor and regulating the collector voltage of the power transistor to amplify a third portion of the 8PSK-modulated signal into the ramp down portion of the EDGE-compliant burst output signal, whereby the power transistor operates in saturated mode, wherein regulating the collector voltage of the power transistor to amplify the third portion of the 8PSK-modulated signal comprises setting the collector voltage of the power transistor equal to the second ramp control signal, and;
   generating the second baseband signal and the second ramp control signal from an EDGE digital data stream, the EDGE digital data stream comprising a set of leading bits followed by a set of data bits followed by a set of trailing bits, wherein generating the second baseband signal comprises:
      replacing the set of leading bits and the set of trailing bits with a first set of replacement bits and a second set of replacement bits, respectively, to generate an adjusted digital data stream, wherein the first set of replacement bits and the second set of replacement bits all have a common logic state; and
      performing digital-to-analog conversion on the adjusted digital data stream to generate the second baseband signal.

12. The method of claim 11, further comprising:
   generating the GMSK-modulated signal by modulating a first baseband signal onto a first carrier frequency using GMSK modulation; and
   generating the 8PSK-modulated signal by modulating a second baseband signal onto a second carrier frequency using 8PSK modulation.

13. A method for operating a transmitter, the method comprising:
- receiving a first digital data bit stream, the first digital data bit stream comprising a first set of leading bits followed by a first set of data bits followed by a first set of trailing bits;
- replacing the first set of leading bits with a first set of constant replacement bits to generate a first modified bit stream;
- generating a first modulated signal by applying a first modulation type to the first modified bit stream;
- amplifying the first modulated signal into a ramp up portion of a first burst output signal;
- generating a second modulated signal by applying the first modulation type to the first set of data bits;
- amplifying the second modulated signal into a data burst portion of the first burst output signal;
- replacing the first set of trailing bits with a second set of constant replacement bits to generate a second modified bit stream;
- generating a third modulated signal by applying the first modulation type to the second modified bit stream; and
- amplifying the second modulated signal into a ramp down portion of the first burst output signal.

14. The method of claim 13, wherein the first modulation type is Eight Phase Shift Keying (8PSK) modulation, and wherein the first burst output signal is an Enhanced Data for Global Evolution (EDGE)-compliant signal.

15. The method of claim 14, further comprising:
receiving a second digital data bit stream;
generating a fourth modulated signal by applying GMSK modulation to the second digital data bit stream; and
amplifying the fourth modulated signal into a second burst output signal, wherein the second burst output signal is a Global System for Mobile Telecommunication (GSM)-compliant signal.

16. The method of claim 14, wherein the first set of leading bits comprises a first set of tail bits and the first set of trailing bits comprises a second set of tail bits, the first set of tail bits and the second set of tail bits all having a first logic state, and
wherein the first set of constant replacement bits and the second set of constant replacement bits all have the first logic state.

17. The method of claim 13, wherein the transmitter comprises a variable gain amplifier (VGA) and a power amplifier (PA), the PA comprising a power transistor,
wherein amplifying the first modulated signal comprises applying a first gain to the first modulated signal using the VGA to generate a first amplified signal, applying a second gain to the first amplified signal using the PA to generate the ramp up portion of the first burst output signal, and supplying a first ramp control signal to a collector of the power transistor to control the second gain,
wherein amplifying the second modulated signal comprises applying the first gain to the second modulated signal using the VGA to generate a second amplified signal, applying a third gain to the second amplified signal using the PA to generate the data burst portion of the first burst output signal, and supplying a fixed voltage to the collector of the power transistor to control third gain, and
wherein amplifying the third modulated signal comprises applying the first gain to the third modulated signal using the VGA to generate a third amplified signal, applying a fourth gain to the third amplified signal using the PA to generate the ramp down portion of the first burst output signal, and supplying a second ramp control signal to the collector of the power transistor to control the fourth gain.

18. The method of claim 17, wherein the fixed voltage comprises a supply voltage of the transmitter.

* * * * *